(12) United States Patent
Hirai et al.

(10) Patent No.: US 6,680,623 B2
(45) Date of Patent: Jan. 20, 2004

(54) INFORMATION PROCESSING APPARATUS HAVING A REDUCED SIGNAL DISTORTION BETWEEN A MODULE AND A MEMORY

(75) Inventors: Tendo Hirai, Kawasaki (JP); Atsushi Serizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

(21) Appl. No.: 10/029,201

(22) Filed: Dec. 28, 2001

(65) Prior Publication Data

US 2003/0020511 A1 Jan. 30, 2003

(30) Foreign Application Priority Data

Jul. 30, 2001 (JP) .......................................... 2001-230047

(51) Int. Cl.[7] .......................... H03K 19/003; H03H 7/38
(52) U.S. Cl. ............................ 326/30; 326/26; 333/124
(58) Field of Search ..................... 326/30, 26; 333/124, 333/127, 125, 134

(56) References Cited

U.S. PATENT DOCUMENTS 5,955,889 A * 9/1999 Taguchi et al. ............... 326/30
6,067,594 A * 5/2000 Perino et al. ............... 710/301
6,438,012 B1 * 8/2002 Osaka et al. ................. 365/52

FOREIGN PATENT DOCUMENTS

| JP | 52-87934 | 7/1977 |
| JP | 2000-267775 | 9/2000 |

* cited by examiner

*Primary Examiner*—James H Cho
(74) *Attorney, Agent, or Firm*—Arent Fox Kintner Plotkin & Kahn (57) ABSTRACT

In an information processing apparatus, a transmission distortion of a signal transmitted between a module and a controller is reduced. A plurality of modules and a controller controlling the modules are mounted on a circuit board. A bus line connects the controller to the modules, the bus line including a main line and a plurality of branch lines each of which is branched from the main line and is connected to a respective one of the modules. Impedance matching elements are provided to the main line of the bus line so as to match a characteristic impedance between the controller and each of the modules. Each of the impedance matching elements is located behind a branch point of one of the branch lines connected to the respective one of the modules with respect to the controller.

12 Claims, 7 Drawing Sheets

INFORMATION PROCESSING APPARATUS HAVING A REDUCED SIGNAL DISTORTION BETWEEN A MODULE AND A MEMORY

BACKGROUND OF THE INVENTION

1. Field of the Invention

The present invention generally relates to information processing apparatuses and, more particularly, to an information processing apparatus having a plurality of modules connected to a high-speed bus.

2. Description of the Related Art

In recent years, in the computer field, data transmission rate has been increased with improvements in the processing speed. For example, on a motherboard, data transmission between a memory and a system controller is performed at a data transmission rate of 266 MHz.

The improvements in the data transmission rate causes a problem relates to an influence of impedance mismatching of buses provided on a motherboard. In order to increase the data transmission rate of a motherboard, it is necessary to match the impedance on a bus.

In a conventional motherboard, modules are arranged as close as possible to each other or a series resistor is provided in the modules so as to correspond to an increase in the data transmission rate. The conventional motherboard can mount a maximum of four memory modules such as DDR SDRAM (Double Data Rate Synchronous DRAM) modules having a data transmission rate of 266 MHz.

Figure 1:
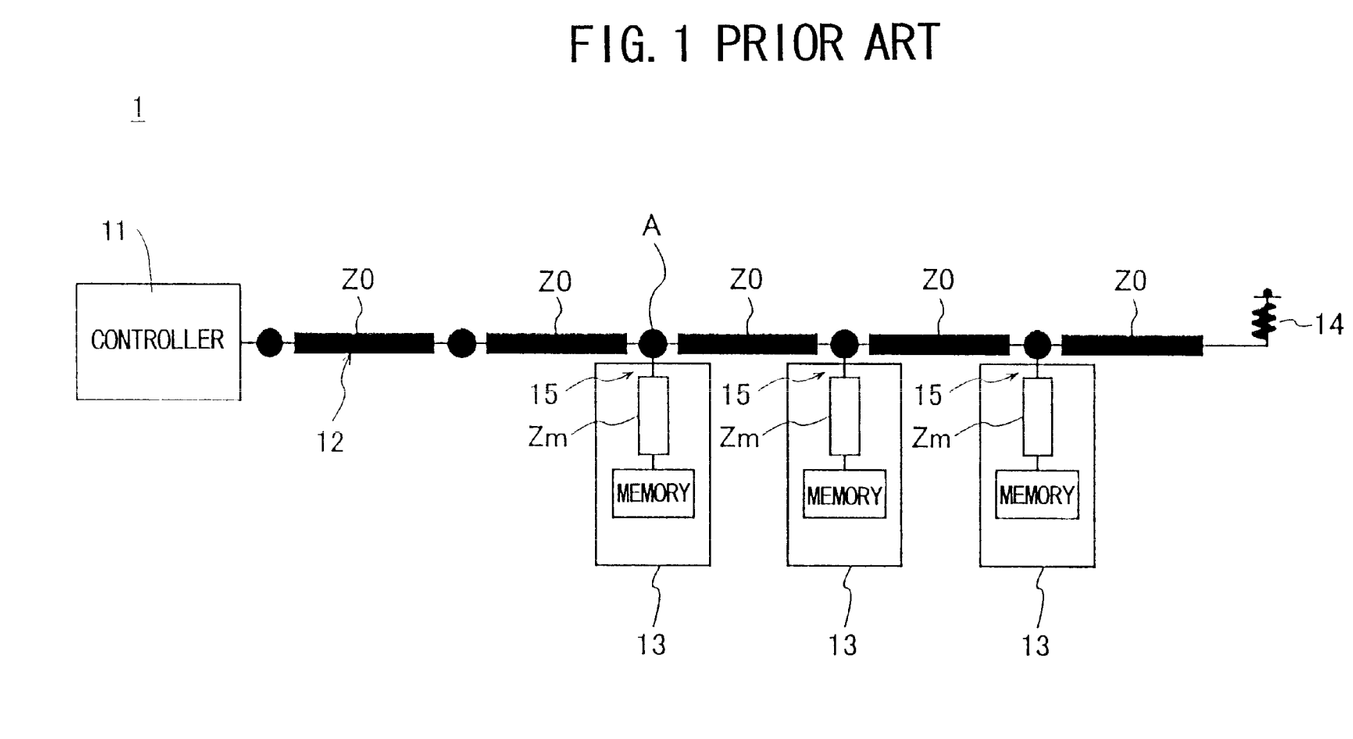
FIG. 1 is a diagram of an equivalent circuit of a part of a conventional motherboard.

FIG. 1 shows a diagram of an equivalent circuit of a part of a conventional motherboard. The equivalent circuit of the part of the motherboard 1 includes a controller 11, a wiring 12, memory modules 13 and a terminating resistance 14. The controller 11 is connected to the memory module 13 via the wiring 12 so as to control the memory module 13. The wiring 12 is provided on the motherboard and has a characteristic impedance being set to Z0. An internal wiring 15 of the memory module 13 has a characteristic impedance being set to Zm.

An impedance Zcont of a point A when seen from the controller 11 side and an impedance Zmem of the point A when seen from the memory module 13 side are represented by the following equations.

$$Zcont = 1/((1/Zm)+(1/Z0)) \quad (1)$$

$$Zmem = 1/((1/Z0)+(1/Z0)) \quad (2)$$

It is desirous to set the impedances Zcont and Zmem to be as follows.

$$Zcont = Z0 \quad (3)$$

$$Zmem = Zm \quad (4)$$

However, such a solution does not exist in the above-mentioned equations (1) and (2).

Here, if Z0=50 Ω and Zm=75 Ω, it is set to Zcont=30 Ω and Zmem=25 Ω from the equations (1) and (2).

As indicated in the above-mentioned equations (3) and (4), since an ideal impedance of Zcont is 50 Ω and an ideal impedance of Zmem is 75 Ω, there is a large mismatch between the ideal impedances and the actual impedances.

According to the conventional connecting method of a memory module, the impedance Zmem at a branch point becomes 25 Ω when the memory module 13 is seen from the wiring 12 due to mismatching of characteristic impedances. This impedance is a value far smaller than the ideal impedance Zmem=75 Ω.

For this reason, there is a problem in that a signal distortion occurs in a transmission signal due to a reflective wave.

SUMMARY OF THE INVENTION

It is a general object of the present invention to provide an improved and useful image processing apparatus in which the above-mentioned problems are eliminated.

A more specific object of the present invention is to provide an information processing apparatus which can reduce a transmission distortion of a signal transmitted between a module and a controller.

In order to achieve the above-mentioned objects, there is provided according to the present invention an information processing apparatus comprising: a circuit board; a plurality of modules mounted on the circuit board; a controller mounted on the circuit board so as to control the modules; a bus line connecting the controller to the modules, the bus line including a main line and a plurality of branch lines each of which is branched from the main line and is connected to a respective one of the modules; and impedance matching elements provided to the main line of the bus line so as to match a characteristic impedance between the controller and each of the modules, each of the impedance matching elements being located behind a branch point of one of the branch lines connected to the respective one of the modules with respect to the controller.

In one embodiment of the present invention, each of the impedance matching elements may be a chip inductor or an inductance element.

Additionally, the modules may be mounted on the circuit board via a predetermined number of connectors previously mounted on the circuit board, and a dummy module having an impedance equal to an impedance of each module may be attached to one of the connectors to which the module is not attached.

Additionally, there is provided according to another aspect of the present invention a circuit bard comprising: a plurality of modules mounted on the circuit board; a controller mounted on the circuit board so as to control the modules; a bus line connecting the controller to the modules, the bus line including a main line and a plurality of branch lines each of which is branched from the main line and is connected to a respective one of the modules; and impedance matching elements provided to the main line of the bus line so as to match a characteristic impedance between the controller and each of the modules, each of the impedance matching elements being located behind a branch point of one of the branch lines connected to the respective one of the modules with respect to the controller.

Further, there is provided according to another aspect of the present invention a connecting method of a plurality of modules to a controller mounted on a circuit board, comprising the steps of: preparing a bus line formed on the circuit board so as to connect the controller to the modules, the bus line including a main line and a plurality of branch lines each of which is branched from the main line and is connected to a respective one of the modules; and applying impedance matching of a characteristic impedance between the controller and each of the modules, the impedance matching being performed at a location behind a branch point of one of the branch lines connected to the respective one of the modules with respect to the controller.

According to the above-mentioned invention, impedance matching is achieved between the controller and each of the modules at a location behind a branch point of each branch line with respect to the controller. Thus, a distortion of transmission waveform of a transmission signal can be reduced, thereby increasing a signal transmission rate and increasing a number of modules mountable to the circuit board.

Other objects, features and advantages of the present invention will become more apparent from the following detailed description when read in conjunction with the accompanying drawings.

DETAILED DESCRIPTION OF THE PREFERRED EMBODIMENTS

Figure 2:
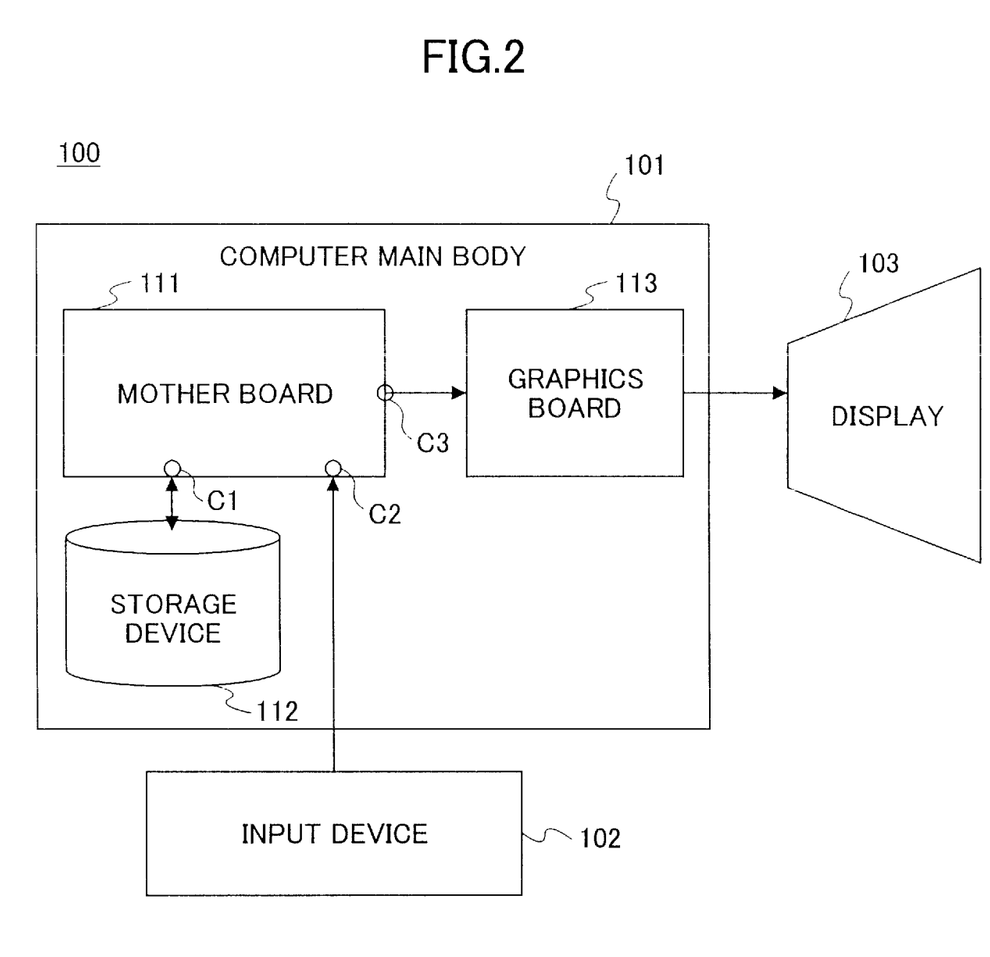
FIG. 2 is a block diagram of a personal computer system according to one embodiment of the present invention.

FIG. 2 shows an outline of a structure of a personal computer system according to one embodiment of the present invention. In the present embodiment, the personal computer system is explained as an information processing apparatus.

The information processing apparatus 100 according to the present embodiment mainly comprises a computer main part 101, an input device 102 and a display 103. The computer main part 101 comprises a motherboard 111, a storage device 112 and a graphics board 113, which are accommodated in a housing.

A storage device connector C1, an I/O connector C2 and a PCI extension connector C3 are mounted on the motherboard 111. The storage device 112 is connected to the storage device connector C1. The input device 102 is connected to the I/O connector C2. The graphics board 113 is connected to the PCI extension connector C3.

The storage device 112 includes a hard disk drive, a CD-ROM drive, a floppy disk drive, etc. The storage device 112 stores information such as OS, various programs and data. The input device 102 includes a keyboard, a mouse, etc. and is used for inputting commands or data. The graphics board 113 receives image data, develops the received image data to screen data, and outputs the developed data to the display 103. The display 103 includes a CRT, an LCD, etc. and displays the screen data received from the graphics board 113.

A detailed description will now be given of the motherboard 111.

Figure 3:
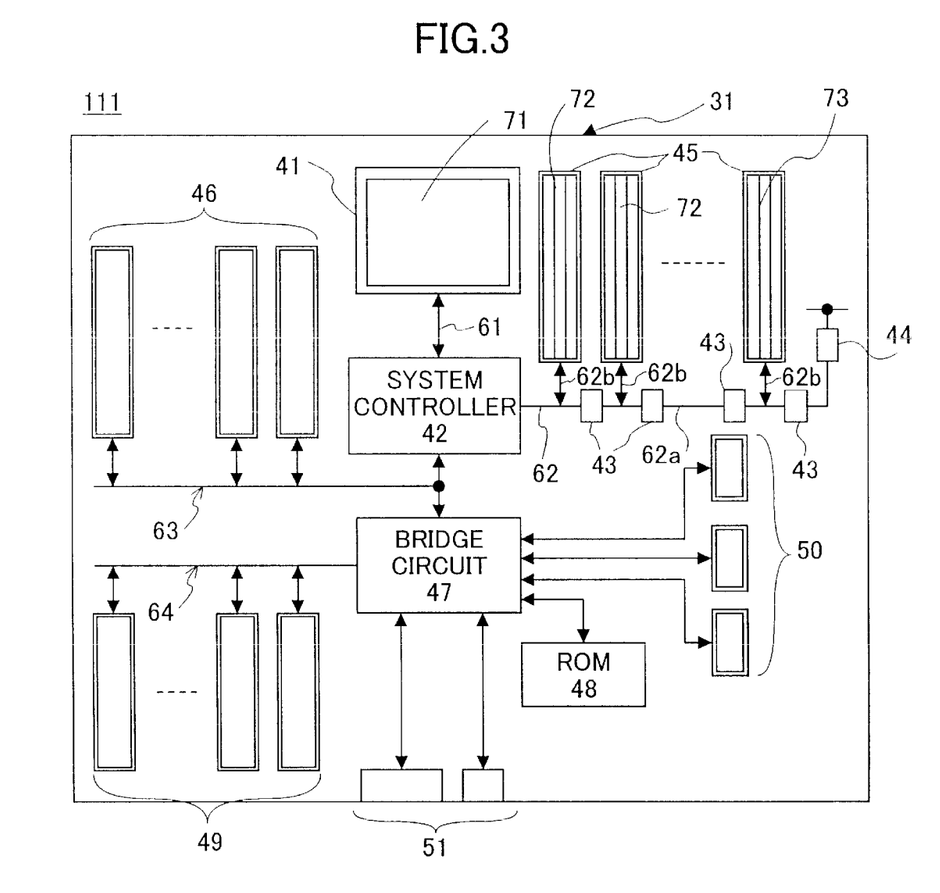
FIG. 3 is a diagram of a structure of a motherboard built in a computer main body shown in FIG. 2.

FIG. 3 is a diagram of a structure of the motherboard built in the computer main body shown in FIG. 2. The motherboard 111 includes a multilayer board 31. Mounted on the mutilayer board 31 are a CPU socket 41, a system controller 42, a chip inductor 43, a terminating resistor 44, a memory connector 45, PCI extension connectors 46, a bridge circuit 47, a ROM 48, ISA extension connectors 49, a storage device connector 50 and I/O connectors 51. Moreover, various wirings such as a system bus 61, a memory bus 62, a PCI bus 63 and an ISA bus 64 are formed on the multilayer board 31.

The CPU socket 41 is equipped with the CPU module 71. The CPU module 71 is provided with a CPU, first and second cache, etc., so as to perform arithmetic operations based on programs. The CPU socket 41 is connected to the system controller 42 through the system bus 61. The system controller 42 is connected to n memory connectors 45 through the memory bus 62. The memory bus 62 comprises a main line 62a and branch lines 62b. The main line 62a of the memory bus 62 is provided with the chip inductor 43 between connecting points of branch lines 62b. The chip inductor 43 has a function to match a characteristic impedance of the memory bus 62 to a predetermined impedance as explained later in detail. In addition, each of the memory connectors 45 is equipped with a memory module 72 or a dummy module 73.

Figure 4A:
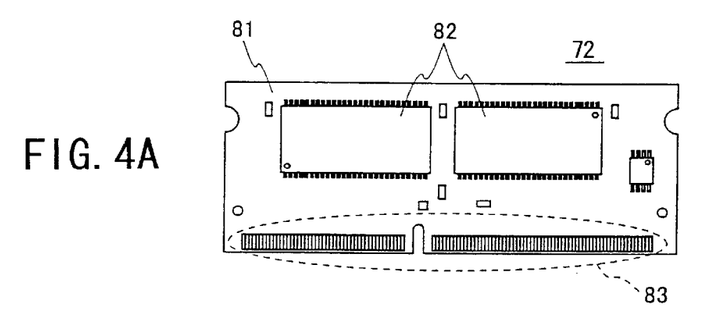
FIG. 4A is a front view of a memory module shown in FIG. 3.
Figure 4B:
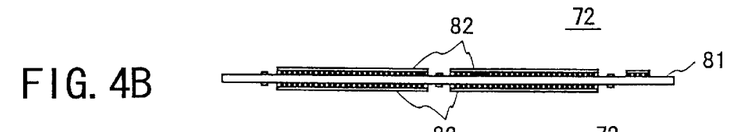
FIG. 4B is a plan view of the memory module.
Figure 4C:
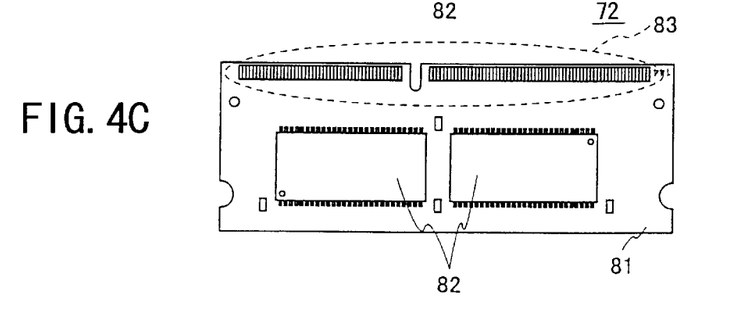
FIG. 4C is a back view of the memory module.
Figure 4D:
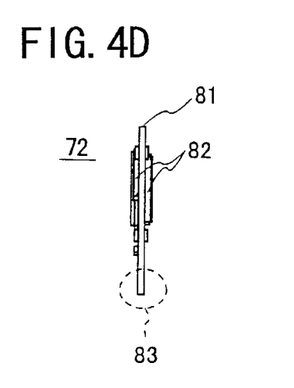
FIG. 4D is a side view of the memory module.

FIG. 4A is a front view of the memory module 72; FIG. 4B is a plan view of the memory module 72; FIG. 4C is a back view of the memory module 72; and FIG. 4D is a side view of the memory module 72. The memory module 72 comprises a circuit board 81 and memory chips 82 mounted on the circuit board 81.

A connection part 83, which is connected to the memory connectors 45 mounted on the motherboard 111, is formed on the circuit board 81. When the connection part 83 is connected to one of the memory connectors 45, the memory module 72 is connected to the corresponding branch line 62b of the memory bus 62. In addition, the dummy module 73 has the same outer configuration as the memory module 72.

A capacitor having the same capacitance with the capacitance of the memory module 72 is mounted on the circuit board 81. The dummy module 73 is attached to one of the memory connectors 45 which is not in use. Accordingly, even when the memory module 72 is not attached to the memory connectors 45, a designed characteristic impedance can be obtained by attaching the dummy module 73 to the unused memory connector 45.

Moreover, the system controller 42 is connected to the PCI extension connector 46 and the bridge circuit 47 through the PCI bus 63. Peripheral equipment having an interface corresponding to the PCI bus 63, such as the graphics board 113 or a communication board, is connected to the PCI extension connector 46. The ROM 48 is connected to the bridge circuit 47. The ROM 48 stores boot programs such as BIOS and the like.

Moreover, the ISA extension connector 49 is connected to the bridge circuit 47 through the ISA bus 64. Peripheral equipment having an interface corresponding to the ISA bus 64 is connected to the ISA extension connector 49. Furthermore, the storage device connectors 50 are connected to the bridge circuit 47.

A floppy disk drive, a hard disk drive and a CD-ROM drive are connected to the storage device connectors 50. The I/O connectors 51 are connected to the bridge circuit 47. The I/O connectors 51 include a PS/2 port, a serial port, a parallel port and a USB port. The I/O connectors 51 are exposed to outside of the housing, and external peripheral apparatuses such as the input device 102 is connected thereto.

In addition, a power supply connector and various LSIs are mounted on the motherboard 111.

Figure 5:
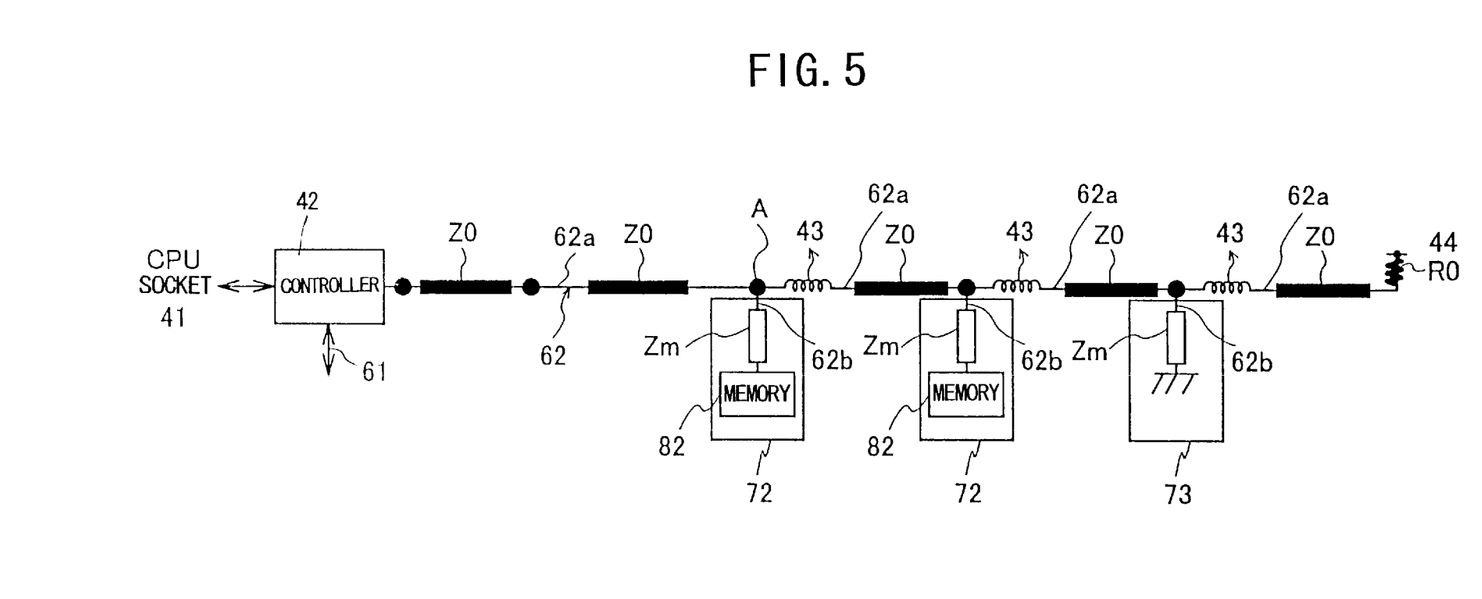
FIG. 5 is a circuit diagram of an equivalent circuit around a memory bus according to the embodiment of the present invention.

A description will now be given in detail of the characteristic impedance of the memory bus 62 according to the present invention. FIG. 5 is a circuit diagram of an equivalent circuit around the memory bus according to the embodiment of the present invention.

In the present embodiment, as shown in FIG. 5, the chip inductor 43 is provided on the main line 62a of the memory bus 62. Thereby, the impedance Zs of the bus line 62 in the vicinity of the memory module 72 can be expressed by the following equation, where L0 is an inductance of the wiring, C0 is a capacitance of the wiring and L is the inductance of the chip inductor.

$$Zs=\sqrt{((L+L0)/C0)} \quad (5)$$

By substituting the impedance Zs of the equation (5) for the characteristic impedance Z0 of the equations (1) and (2), the following equations are obtained.

$$Zcont=1/((1/Zm)+(1/Zs)) \quad (6)$$

$$Zmem=1/((1/Zs)+(1/Zs)) \quad (7)$$

It is ideal from the equations (3) and (4) that Zcont=Z0 and Zmem=Zm, and the inductance L of the chip inductor 43 provided to the bus line 62 can be obtained by solving the following equations (8) and (9) by using the equation (5).

$$Z0=1/((1/Zm)+(1/Zs)) \quad (8)$$

$$Zm=1/((1/Zs)+(1/Zs)) \quad (9)$$

For example, the impedances Z0=50 Ω and Zm=75 Ω can be obtained by providing the inductor 43 having the inductance L so as to set the impedance Zs=150 Ω. Thereby, the impedance Zcont matches Z0 and the impedance Zmem matches Zm.

It should be noted that although factors such as a capacitance of the memory connectors 45 and an input capacity of the device inside the memory module 72 are not taken into consideration in the above-mentioned equations, the characteristic impedance can be set to an impedance close to the ideal impedance by obtaining the inductance L of the chip inductor 43 in consideration of these factors.

Thus, according to the present embodiment, distortion in a transmission signal can be reduced by the impedance matching. For this reason, even if the data transmission rate between the system controller 42 and the memory module is increase, a transmission signal can be transmitted reliably.

Moreover, it becomes possible to mount many memory modules 72 on the motherboard 111. For example, eight pieces of the 266 MHz DDR SDRAM (Double Data Rate Synchronous Dynamic Random Access Memory) memory modules can be mounted, while only four pieces can be mounted according to the conventional method.

It should be noted that although the chip inductor 43 is used as an inductor element in the present embodiment, the inductance L for impedance matching can be obtained by adjusting an inductance of the main line 62a of the memory bus 62 formed on the motherboard 111.

Figure 6:
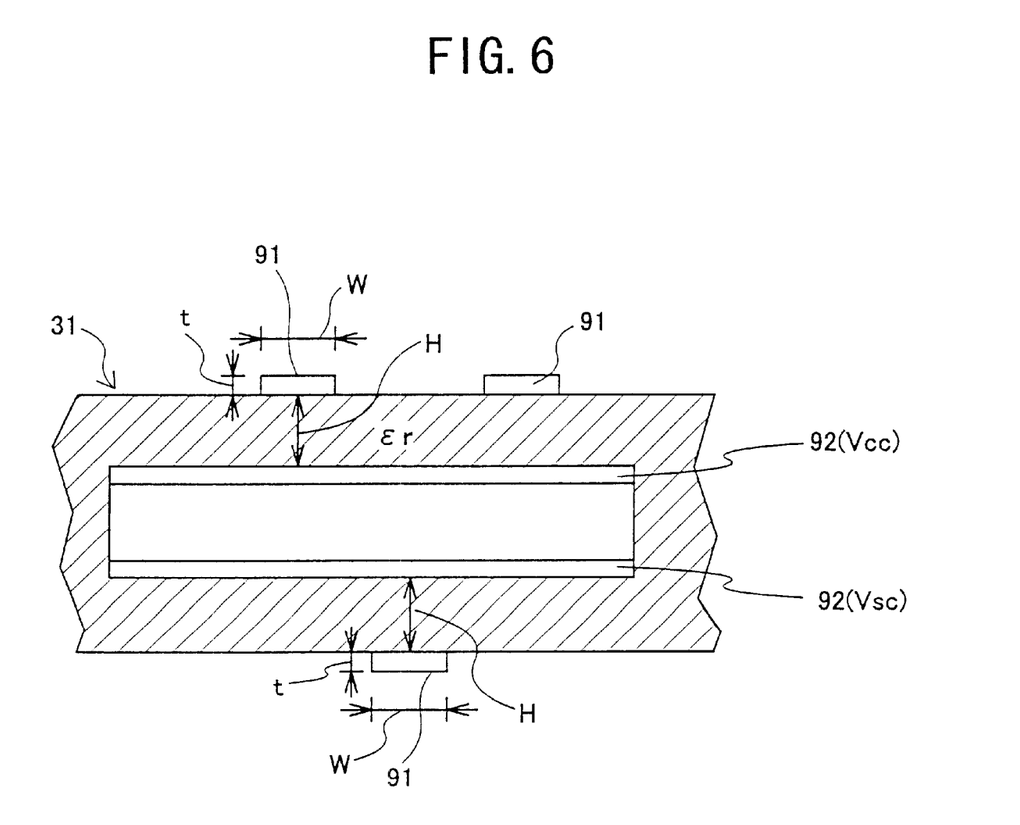
FIG. 6 is a cross-sectional view of a part of a variation of the motherboard according to the embodiment of the present invention.

FIG. 6 is a cross-sectional view of a part of a variation of the motherboard according to the embodiment of the present invention. As shown in FIG. 6, a width w and a thickness t of a circuit pattern 91 of the main line 62 and a height (distance) H of the circuit pattern 91 from the power supply potential lines Vcc and Vss are set so that a desired inductance L is obtained. The inductance L is determined by a conventional calculation method based on the width w, the thickness t, the height H and a dielectric constant ∈r of the circuit board 31.

In addition, although the chip inductor 43 is provided to the main line 62a in the present embodiment, the chip inductor 43 may be provided to the branch line 62b which connects the main line 62a to the memory module 72.

Moreover, although the impedance matching is carried out by an inductance element in the present embodiment since the impedance of the memory module 72 is a capacitive impedance, the present invention is not limited to this and the impedance matching may be carried out by a capacitance element in response to a module connected to the motherboard.

Furthermore, although the personal computer system is used as an example of an information processing apparatus in the present embodiment, the application field of the present embodiment is not limited to the personal computer system and can also be applied to other information processing apparatuses such as a server.

A result of simulation is explained below of a case in which eight pieces of memory modules are used with a frequency of 133 MHz.

Figure 7A:
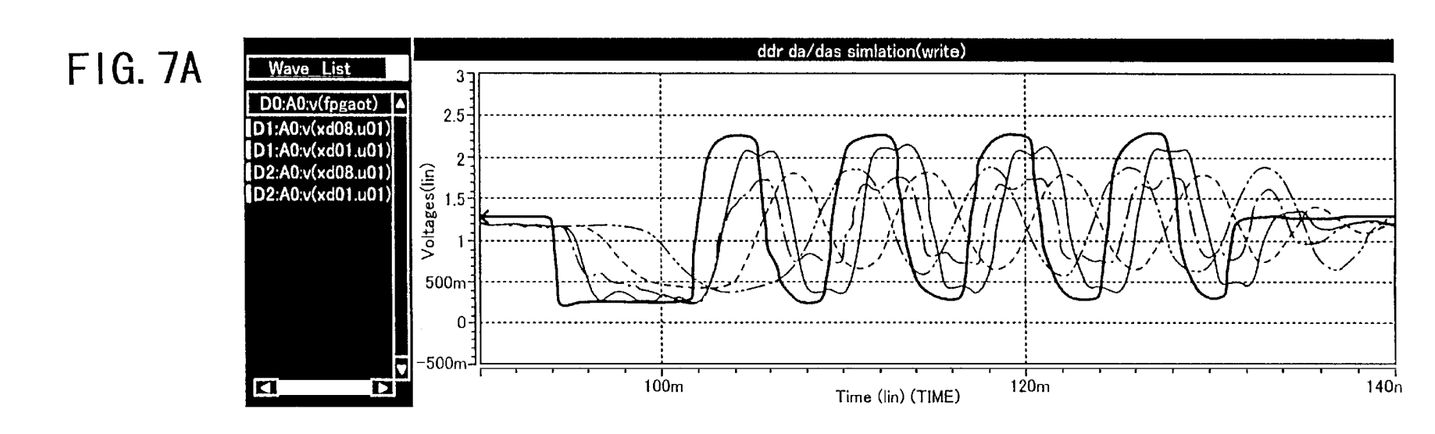
FIG. 7A is a graph showing simulated waveforms of a transmission signal when a write operation is performed on a memory module.
Figure 7B:
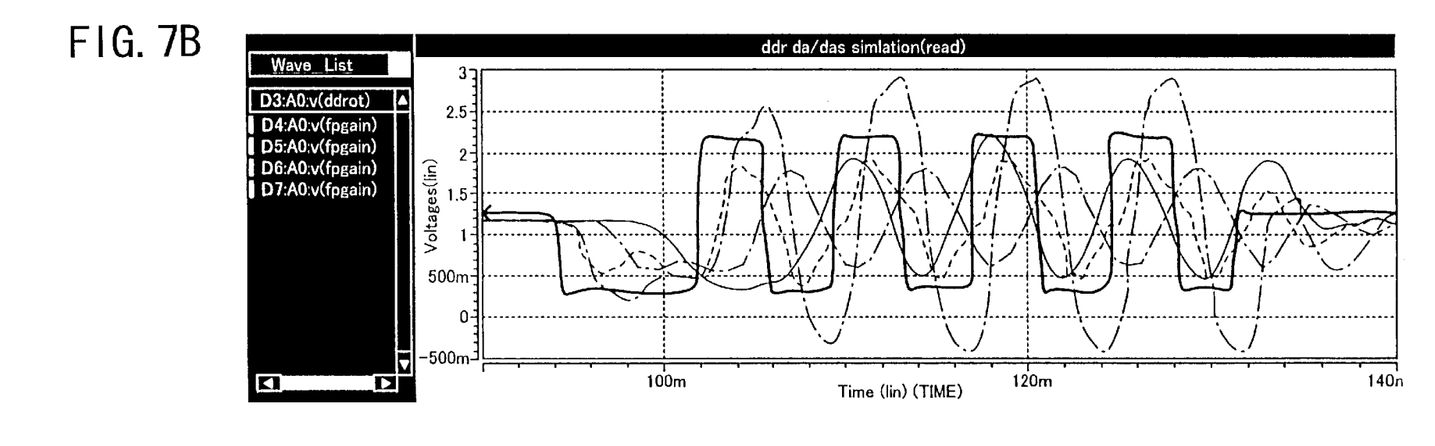
FIG. 7B is a graph showing simulated waveforms of a transmission signal when a read operation is performed on a memory module.

FIG. 7A shows simulated waveforms of a transmission signal when a write operation is performed on the memory module 72. FIG. 7B shows simulated waveforms of a transmission signal when a read operation is performed on the memory module 72. In each of FIGS. 7A and 7B, a bold solid line indicates a waveform in a no-load state (a state where there is no wiring and memory modules but a terminating resistor), which corresponds to a reference waveform.

A dotted line in FIG. 7A shows a write waveform obtained at the furthest memory module from the system controller 42 of the memory bus 62 when the inductance L=0 nH. A single dashed chain line FIG. 7A shows a write waveform obtained by the memory module closest to the system controller 42 of the memory bus 62 when the inductance L=0 nH. A double dashed chain line in FIG. 7A shows a write waveform obtained at the furthest memory module from the system controller 42 of the memory bus 62 when the inductance L=27 nH. A thin solid line FIG. 7A shows a write waveform obtained by the memory module closest to the system controller 42 of the memory bus 62 when the inductance L=27 nH. Thus, it can be appreciated that the write waveform is closer to the reference waveform indicated by the bold solid line in the case where the inductance L=27 nH is provided to the memory bus 62 than the case where the inductance L=0 nH, that is, the inductance is not provided to the memory bus 62.

A dotted line in FIG. 7B shows a read waveform from the memory module closest to the system controller 42 of the memory bus 62 when the inductance L=0 nH. A single dashed chain line in FIG. 7B shows a read waveform from the furthest memory module from the system controller 42 of the memory bus 62 when the inductance L=0 nH. A double dashed chain line in FIG. 7B shows a read waveform from the memory module closest to the system controller 42 of the memory bus 62 when the inductance L=27 nH. A thin solid line in FIG. 7B shows a read waveform from the furthest memory module from the system controller 42 of the memory bus 62 when the inductance L=27 nH. Thus, it can be appreciated that the write waveform has a smaller distortion and a larger amplitude in the case where the inductance L=27 nH is provided to the memory bus 62 than the case where the inductance L=0 nH, that is, the inductance is not provided to the memory bus 62.

The present invention is not limited to the specifically disclosed embodiments, and variations and modifications may be made without departing from the scope of the present invention.

The present application is based on Japanese priority application No. 2001-230047 filed on Jul. 30, 2001, the entire contents of which are hereby incorporated by reference.

What is claimed is:

1. An information processing apparatus comprising:

a circuit board;

a plurality of modules mounted on said circuit board;

a controller mounted on said circuit board so as to control said modules;

a bus line connecting said controller to said modules, the bus line including a main line and a plurality of branch lines each of which is branched from said main line and is connected to a respective one of said modules; and impedance matching elements provided to said main line of said bus line so as to match a characteristic impedance between said controller and each of said modules, each of said impedance matching elements being located behind a branch point of one of the branch lines connected to the respective one of said modules with respect to said controller.

2. The information processing apparatus as claimed in claim 1, wherein each of said impedance matching elements is a chip inductor.

3. The information processing apparatus as claimed in claim 1, wherein each of said impedance matching elements is an inductance element.

4. The information processing apparatus as claimed in claim 1, wherein said modules are mounted on said circuit board via a predetermined number of connectors previously mounted on said circuit board, and a dummy module having an impedance equal to an impedance of each module is attached to one of said connectors to which said module is not attached.

5. A circuit bard board comprising:

a plurality of modules mounted on said circuit board;

a controller mounted on said circuit board so as to control said modules;

a bus line connecting said controller to said modules, the bus line including a main line and a plurality of branch lines each of which is branched from said main line and is connected to a respective one of said modules; and impedance matching elements provided to said main line of said bus line so as to match a characteristic impedance between said controller and each of said modules, each of said impedance matching elements being located behind a branch point of one of the branch lines connected to the respective one of said modules with respect to said controller.

6. The circuit board as claimed in claim 5, wherein each of said impedance matching elements is a chip inductor.

7. The circuit board as claimed in claim 5, wherein each of said impedance matching elements is an inductance element.

8. The circuit board as claimed in claim 5, wherein said modules are mounted on said circuit board via a predetermined number of connectors previously mounted on said circuit board, and a dummy module having an impedance equal to an impedance of each module is attached to one of said connectors to which said module is not attached.

9. A connecting method of a plurality of modules to a controller mounted on a circuit board, comprising the steps of:

preparing a bus line formed on said circuit board so as to connect said controller to said modules, the bus line including a main line and a plurality of branch lines each of which is branched from said main line and is connected to a respective one of said modules; and applying impedance matching of a characteristic impedance between said controller and each of said modules, the impedance matching being performed at a location behind a branch point of one of the branch lines connected to the respective one of said modules with respect to said controller.

10. The connecting method as claimed in claim 9, wherein the impedance matching is performed by providing a chip inductor to said main line of said bus line.

11. The connecting method as claimed in claim 9, wherein the impedance matching is performed by providing an inductance element to said main line of said bus line.

12. The connecting method as claimed in claim 9, wherein said modules are mounted on said circuit board via a predetermined number of connectors previously mounted on said circuit board, and a dummy module having an impedance equal to an impedance of each module is attached to one of said connectors to which said module is not attached.

* * * * *